(12) United States Patent
Camerlo et al.

(10) Patent No.: US 7,185,821 B1
(45) Date of Patent: Mar. 6, 2007

(54) METHOD AND APPARATUS FOR DELIVERING HIGH-CURRENT POWER AND GROUND VOLTAGES USING TOP SIDE OF CHIP PACKAGE SUBSTRATE

(75) Inventors: Sergio Camerlo, Cupertino, CA (US); Yida Zou, San Jose, CA (US); Luca Cafiero, Palo Alto, CA (US); Gary L. Myers, San Ramon, CA (US); Bobby Parizi, San Jose, CA (US); Hsing-Sheng Liang, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 240 days.

(21) Appl. No.: 10/614,905

(22) Filed: Jul. 7, 2003

(51) Int. Cl.
*G06K 19/02* (2006.01)

(52) U.S. Cl. .................................. 235/488

(58) Field of Classification Search ............. 257/678, 257/684, 690, 693, 696; 361/707, 709; 235/488, 235/492
See application file for complete search history.

(56) References Cited

U.S. PATENT DOCUMENTS

| | | | |
|---|---|---|---|
| 5,306,948 A * | 4/1994 | Yamada et al. | 257/690 |
| 5,866,943 A * | 2/1999 | Mertol | 257/712 |
| 5,959,348 A * | 9/1999 | Chang et al. | 257/700 |
| 5,977,640 A * | 11/1999 | Bertin et al. | 257/777 |
| 6,054,759 A * | 4/2000 | Nakamura | 257/691 |
| 6,282,100 B1 * | 8/2001 | Degani et al. | 361/760 |
| 6,294,406 B1 * | 9/2001 | Bertin et al. | 438/109 |
| 6,336,269 B1 * | 1/2002 | Eldridge et al. | 29/885 |
| 6,558,978 B1 * | 5/2003 | McCormick | 438/108 |
| 6,642,610 B2 * | 11/2003 | Park et al. | 257/678 |
| 6,777,794 B2 * | 8/2004 | Nakajima | 257/686 |
| 6,803,646 B2 * | 10/2004 | Shibue | 257/667 |
| 6,906,425 B2 * | 6/2005 | Stewart et al. | 257/778 |
| 6,958,259 B2 * | 10/2005 | Shibue | 438/108 |
| 6,972,481 B2 * | 12/2005 | Karnezos | 257/686 |
| 7,034,388 B2 * | 4/2006 | Yang et al. | 257/686 |
| 2004/0067606 A1 * | 4/2004 | Fehr et al. | 438/109 |

* cited by examiner

*Primary Examiner*—Ahshik Kim
(74) *Attorney, Agent, or Firm*—Thelen Reid Brown Raysman & Steiner LLP; David B. Ritchie

(57) ABSTRACT

An electronic interconnection system for delivering high-current power and ground voltages using a non-bottom side of a chip package substrate. The system includes a printed wiring board (PWB), a chip package, and a bridge lead. The PWB has at least a first and a second contact pad. The chip package includes a chip and a package substrate. The chip is mounted onto the package substrate and the package substrate has a bottom surface having at least a first contact pad and a second surface having at least a second contact pad. The first contact pad of the PWB and the first contact pad of the package substrate are coupled together. The bridge lead couples the second contact pad of the PWB with the second contact pad of the package substrate. The bridge lead may be selected from styles including flying lead, edge wiping, top wiping, and double wiping.

35 Claims, 6 Drawing Sheets

METHOD AND APPARATUS FOR DELIVERING HIGH-CURRENT POWER AND GROUND VOLTAGES USING TOP SIDE OF CHIP PACKAGE SUBSTRATE

FIELD OF THE INVENTION

The present invention relates generally to interconnections between electronic packages and printed wiring boards. More specifically, the present invention relates to an interconnection system between a ball grid array package and a printed wiring board.

BACKGROUND OF THE INVENTION

Electronic systems generally include at least one printed wiring board (PWB) containing one or more integrated circuit (IC) chips or ICs. The IC may be packaged in a number of conventional ways. One prevalent IC package is known as a ball grid array (BGA) package. The name comes from the array of solder balls that are formed on the bottom of the package. The PWB has a corresponding array of pads to which the solder is bonded during the affixing of the BGA package to the PWB. The resulting interconnection is capable of serving a wide variety of applications.

Turning first to FIG. 1, a schematic diagram of two views of a conventional BGA package to PWB interconnection system 10 is shown. The schematic is not to scale. The upper view is a plan view and the lower view is an elevation view. The system 10 includes a BGA package 12 and a PWB 14. The BGA package 12 includes a chip 16, a package substrate 18, and an array of a plurality of solder balls 19. The size, shape, type, and location of the chip 16 will depend on the circumstances but is generally centered on the package substrate 18. The size and shape of the package substrate 18 will depend on the circumstances but is generally rectangular and often square as shown. The size, number, and arrangement of the plurality of solder balls in the array 19 will depend on the circumstances but is generally formed of solder balls of uniform size in rectilinear rows and columns having uniform spacing or pitch in both directions.

In the electronics industry, improvements in functionality and performance are driving the demands for integration to unprecedented levels. With respect to the BGA package 12, the conventional response to the demands has been to increase the size of the package substrate 18, to shrink the pitch of the array 19, or both. These responses increase the number of contacts. Eventually a practical limit will be reached and a new approach will be desired. This is especially true given that higher current demands posed by the higher integration are eroding the relative contact gains of the conventional approach, that is, more and more of the new contacts are dedicated to power delivery and ground connections and not to signal communication.

BRIEF DESCRIPTION OF THE INVENTION

An electronic interconnection system for delivering high-current power and ground voltages using a non-bottom side of a chip package substrate is disclosed. The system includes a printed wiring board (PWB), a chip package, and a bridge lead. The PWB has at least a first and a second contact pad. The chip package includes a chip and a package substrate. The chip is mounted onto the package substrate and the package substrate has a bottom surface having at least a first contact pad and a second surface having at least a second contact pad. The first contact pad of the PWB and the first contact pad of the package substrate are coupled together. The bridge lead couples the second contact pad of the PWB with the second contact pad of the package substrate. The bridge lead may be selected from styles including flying lead, edge wiping, top wiping, and double wiping.

BRIEF DESCRIPTION OF THE DRAWINGS

The accompanying drawings, which are incorporated into and constitute a part of this specification, illustrate one or more exemplary embodiments of the present invention and, together with the detailed description, serve to explain the principles and exemplary implementations of the invention.

In the drawings.

DETAILED DESCRIPTION OF THE INVENTION

Various exemplary embodiments of the present invention are described herein in the context of a method and an apparatus for delivering high-current power and ground voltages using the top side of the chip package substrate. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the specific goals of the developer, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
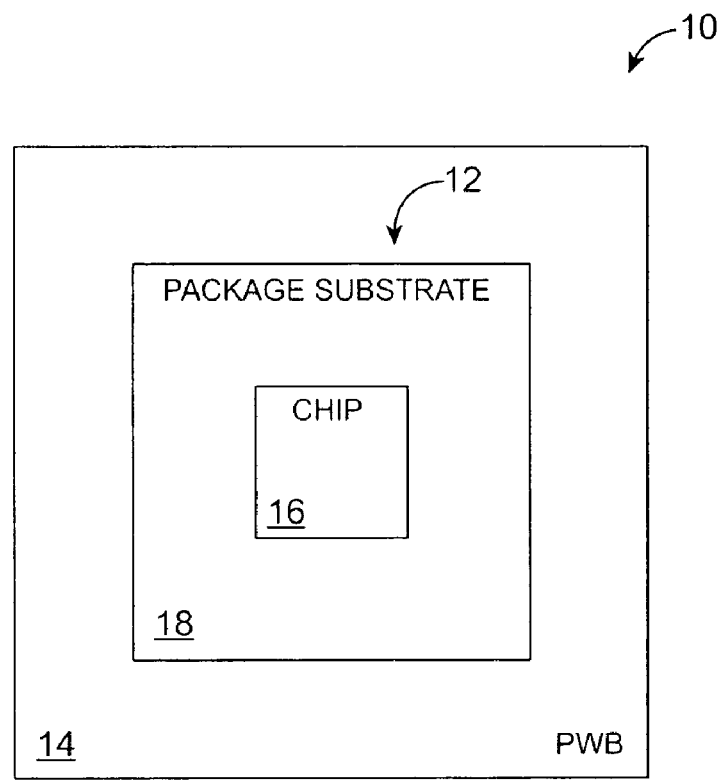
FIG. 1 is a schematic diagram of two views of a conventional BGA package to PWB interconnection system.
Figure 1:
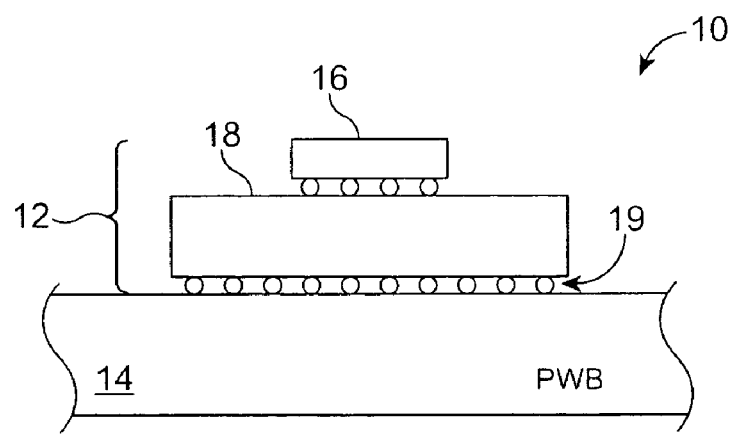
Figure 2:
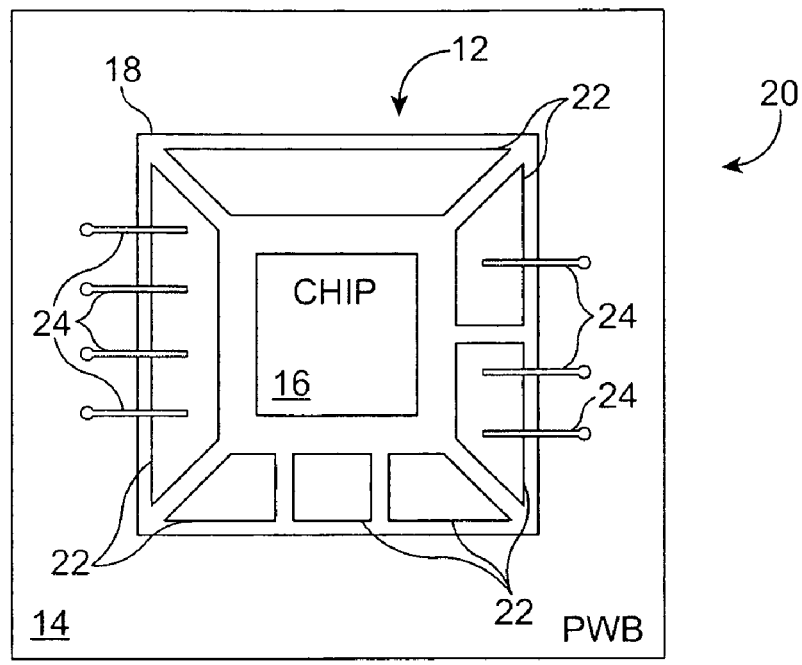
FIG. 2 is a schematic diagram according to an embodiment of the present invention of two views of a BGA package to PWB interconnection system.
Figure 2:
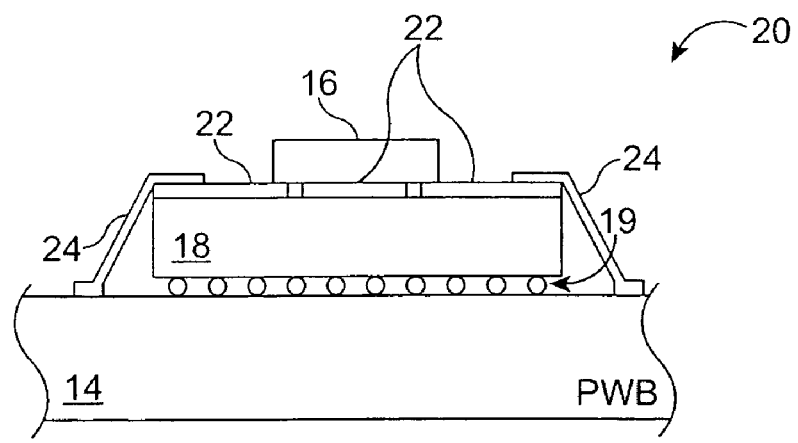

Turning now to FIG. 2, a schematic diagram according to an embodiment of the present invention of two views of a BGA package to PWB interconnection system 20 is shown. The system 20 is similar to the system 10 of FIG. 1 in that it includes the PWB 14 and the BGA package 12 having the chip 16, the package substrate 18, and the array of a plurality of solder balls 19. The discussion that follows will include references to the orientation shown in the figures, but the invention should not be limited to such orientations. In the system 10, the connections between the package substrate 18 and the PWB 14 are limited to the bottom plane of the package substrate 18. By contrast, the system 20 takes advantage of the fact that the package substrate 18 is three dimensional, that is, the system 20 includes connections to the package substrate 18 on more than the bottom surface. In the embodiment shown, a plurality of top-side contact pads 22 are provided on the package substrate 18. The number, size, shape, and location of the pads 22 will depend on the circumstances. Three of the pads 22 are shown connected to the PWB 14 through one or more bridge leads 24. In one embodiment, the leads 24 may be formed by the conventional wire bond technique. The leads 24 are shown only on the right and left sides of the plan view for greater clarity in the elevation view. In practice, any number of leads 24 could be connected to the various pads 22. In addition to the top side, it would also be possible to locate pads on the edges or vertical sides of the package substrate 18. Such edge pads might be limited to the edge or they might run from the top to the edge, from the bottom to the edge, from a first edge to a second edge, or from the top across the edge to the bottom. Edge pads are not shown in FIG. 2 in the interest of greater clarity.

Under the system 20, the connections provided by the various pads 22 and leads 24 could carry any of countless electrical signals. In one embodiment, the electrical signals are limited to those that have lower sensitivity to induced inductance such as constant voltages. For example, one or more of the pads 22 might be dedicated to the ground potential. Other pads 22 might be dedicated to higher potentials such as 1.2V, 1.5V, 1.8V, and the like. The addition of non-bottom-side connections not only increases the number of connections but could be used to free up bottom-side connections for more critical signals by moving less critical signals to the top side of the package substrate 18.

Figure 3:
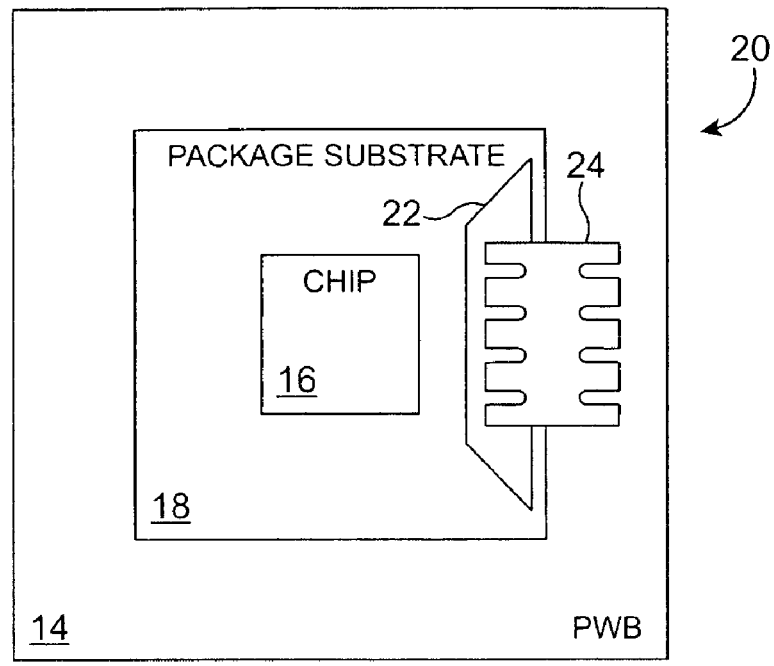
FIG. 3 is a schematic diagram according to the present invention of two views of an embodiment of the bridge leads of FIG. 2.
Figure 3:
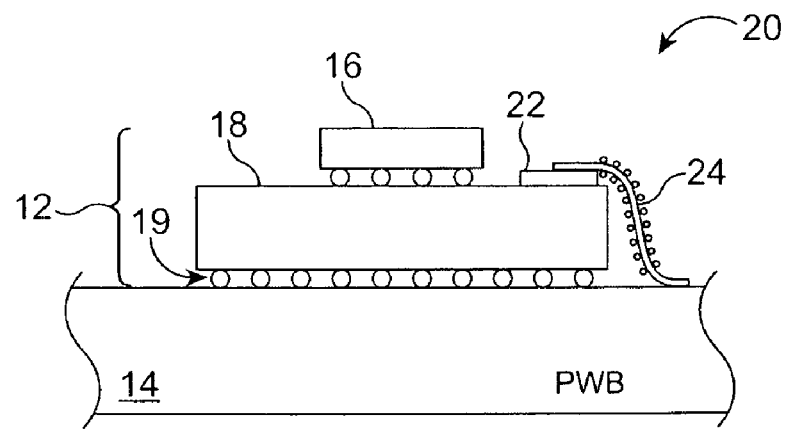

Turning now to FIG. 3, a schematic diagram according to the present invention of two views of an embodiment of the bridge leads 24 of FIG. 2 is shown. This particular embodiment will be referred to as the flying lead style of bridge lead 24. Only one pad 22 and one lead 24 are shown in the interest of greater clarity. In practice, any number of pads 22 and leads 24 might be used. The lead 24 is electrically connected to the package substrate 18 and the PWB 14. The exact size, shape, and placement of the lead 24 will depend on the circumstances. As indicated by a dashed line in the elevation view only, the lead 24 may be at least partially covered in an insulating material.

Figure 4:
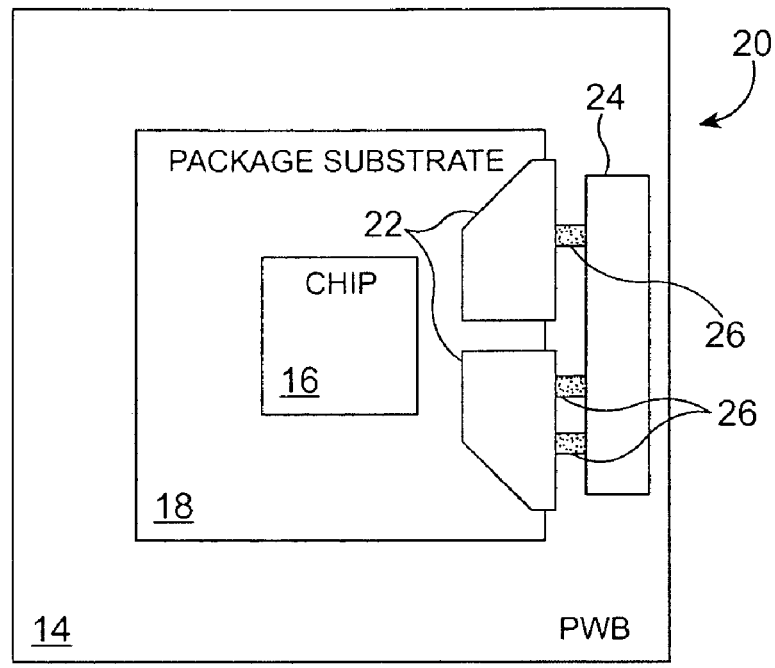
FIG. 4 is a schematic diagram according to the present invention of two views of an embodiment of the bridge leads of FIG. 2.
Figure 4:
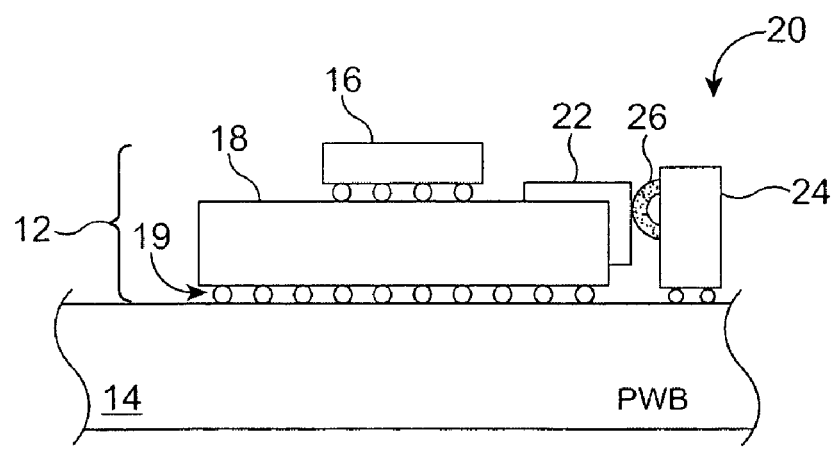

Turning now to FIG. 4, a schematic diagram according to the present invention of two views of an embodiment of the bridge leads 24 of FIG. 2 is shown. This particular embodiment will be referred to as the edge wiping style of bridge lead 24. The embodiment utilizes edge pads 22 as described above. Only two pads 22 and one lead 24 are shown in the interest of greater clarity. In practice, any number of pads 22 and leads 24 might be used. In the example shown, the lead 24 includes three spring type wipers 26 which might be wired separately internally to the lead 24. The lead 24 is electrically and mechanically connected to the PWB 14. For example, press fit pins could be used. The exact size, shape, and placement of the lead 24 will depend on the circumstances.

Figure 5:
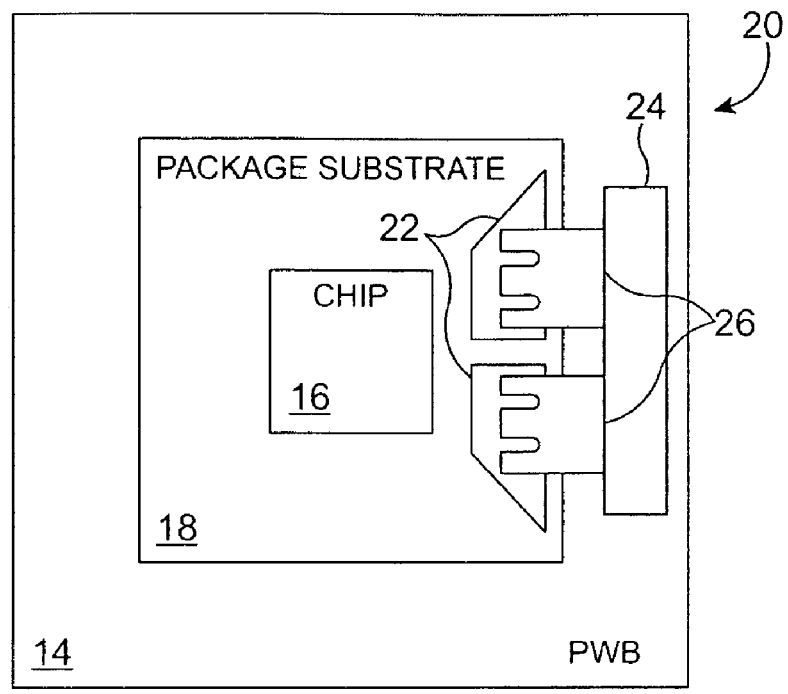
FIG. 5 is a schematic diagram according to the present invention of two views of an embodiment of the bridge leads of FIG. 2.
Figure 5:
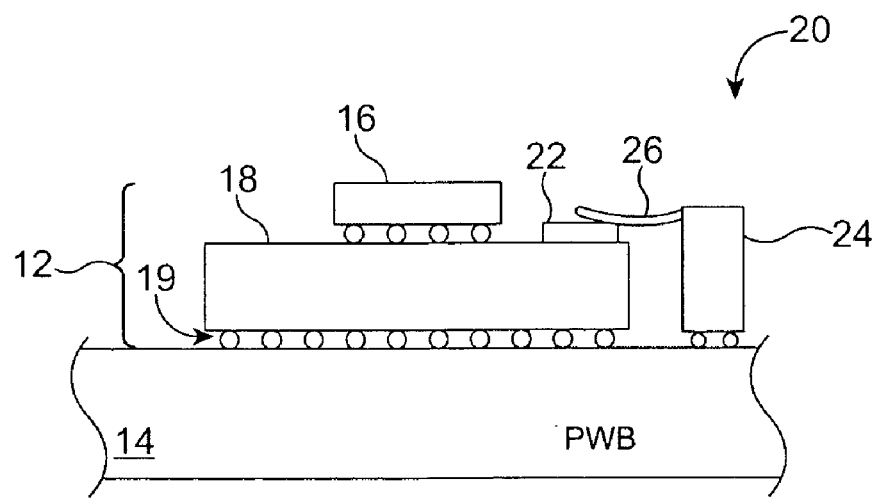

Turning now to FIG. 5, a schematic diagram according to the present invention of two views of an embodiment of the bridge leads 24 of FIG. 2 is shown. This particular embodiment will be referred to as the top wiping style of bridge lead 24. Only two pads 22 and one lead 24 are shown in the interest of greater clarity. In practice, any number of pads 22 and leads 24 might be used. In the example shown, the lead 24 includes two spring type wipers 26 which might be wired separately internally to the lead 24. The lead 24 is electrically and mechanically connected to the PWB 14. Again, for example, press fit pins could be used. The exact size, shape, and placement of the lead 24 will depend on the circumstances.

Figure 6:
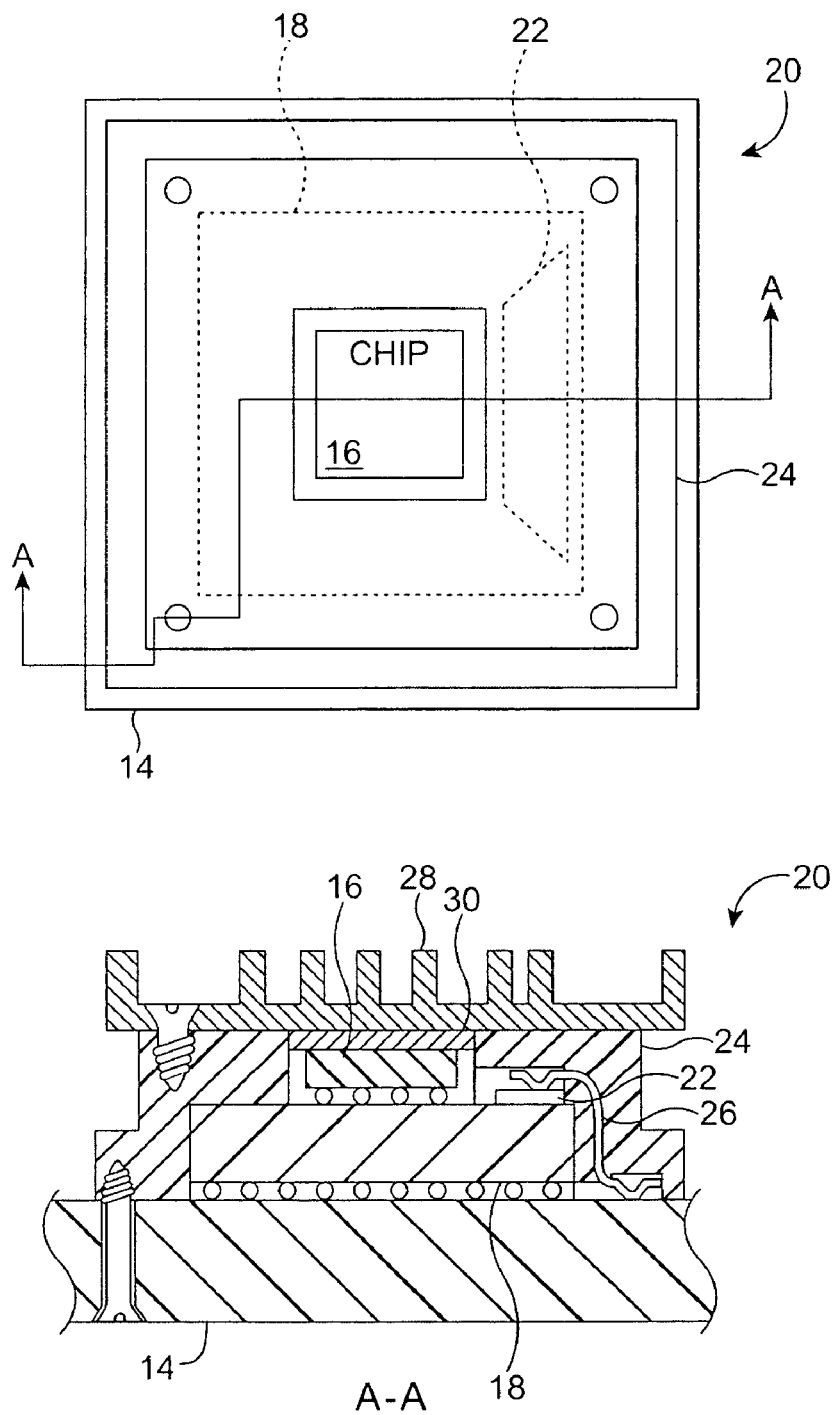
FIG. 6 is a schematic diagram according to the present invention of two views of an embodiment of the bridge leads of FIG. 2.

Turning now to FIG. 6, a schematic diagram according to the present invention of two views of an embodiment of the bridge leads 24 of FIG. 2 is shown. This particular embodiment will be referred to as the double wiping style of bridge lead 24. The upper view is a plan view with an optional heat sink removed. The outline of the package substrate 18 and a single pad 22 are shown in phantom for reference purposes as the lead 24 substantially dominates the plan view. By contrast, the chip 16 is visible through an optional window in the lead 24. The lower view is a cross sectional view along the line A—A with the optional heat sink installed. The system 20 includes the PWB 14, the chip 16, the package substrate 18, and one pad 22 similar to above. Only one pad 22 and one lead 24 are shown in the interest of greater clarity. In practice, any number of pads 22 and leads 24 might be used. Edge pads might also be used. The exact size, shape, and placement of the lead 24 will depend on the circumstances. In the example shown, the lead 24 includes at least one spring type double wiper 26. If more than one wiper 26 is provided, then each might be wired separately internally to the lead 24. The wiper 26 is referred to as a double wiper because it presses against both the pad 22 and the PWB 14 which would be provided with a corresponding pad (not shown). Also shown in the cross sectional view are an optional heat sink 28 and a thermal interface material 30 to draw heat away from the chip 16. The heat sink 28 may be attached to the lead 24 by any suitable means of fastening including a screw as shown. Likewise, the lead 24 may be attached to the PWB 14 by any suitable means of fastening including a screw as shown. The body of the lead 24 alone or in combination with the heat sink 28 may be constructed in such a fashion as to serve as an Electro-Magnetic Interference (EMI) shield to the chip 16. For example, at least a portion of the outer surface of the body of the lead 24 could be coated with a conductive material and grounded as appropriate. The body of the lead 24 alone or in combination with the heat sink 28 may also be constructed in such a fashion as to provide structural support and/or protection for the chip 16 and package substrate 18.

Those of ordinary skill in the art will realize that the various styles of bridge lead embodiments presented above are not necessarily mutually exclusive. Which style of bridge lead or leads are used will depend in part on the circumstances.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An electronic interconnection system comprising:
a printed wiring board (PWB) comprising a first surface having at least a first contact pad and a second contact pad;
a chip package comprising a chip and a package substrate for the chip, wherein the chip is mounted onto the package substrate and the package substrate has a first surface having at least a first contact pad and a second surface having at least a second contact pad;
an electrical connection between the package substrate and the PWB, the electrical connection for coupling the first contact pad of the PWB with the first contact pad of the package substrate; and
a bridge lead for coupling the second contact pad of the PWB with the second contact pad of the package substrate.

2. The system as defined in claim 1, wherein the chip is mounted to the second surface of the package substrate.

3. The system as defined in claim 1, wherein the bridge lead comprises at least one flying lead style of bridge lead.

4. The system as defined in claim 1, wherein the bridge lead comprises at least one edge wiping style of bridge lead.

5. The system as defined in claim 1, wherein the bridge lead comprises at least one top wiping style of bridge lead.

6. The system as defined in claim 1, wherein the bridge lead comprises at least one double wiping style of bridge lead.

7. The system as defined in claim 6, wherein the bridge lead further comprises a heat sink and thermal interface material for extracting heat from the chip.

8. The system as defined in claim 6, wherein the bridge lead further comprises at least a portion of an integrated Electro-Magnetic Interference shield for the chip.

9. The system as defined in claim 1, wherein:
the first surface of the PWB is substantially parallel to the first surface of the package substrate;
the first surface of the package substrate is substantially parallel to the second surface of the package substrate; and
the chip is mounted on the second surface of the package substrate.

10. The system as defined in claim 9, wherein the bridge lead comprises at least one top wiping style of bridge lead.

11. The system as defined in claim 9, wherein the bridge lead comprises at least one double wiping style of bridge lead.

12. The system as defined in claim 11, wherein the bridge lead further comprises a heat sink and thermal interface material for extracting heat from the chip.

13. The system as defined in claim 11, wherein the bridge lead further comprises at least a portion of an integrated Electro-Magnetic Interference shield for the chip.

14. A chip package comprising:
at least one chip; and
a package substrate for the chip comprising a first surface having a ball grid array of a plurality of solder balls adapted to come into contact with a printed wire board (PWB) and a second surface having at least one contact pad adapted to be electrically connected to the PWB, wherein the at least one chip is mounted onto the second surface of the package substrate.

15. The chip package as defined in claim 14, wherein the first surface is substantially orthogonal to the second surface.

16. The chip package as defined in claim 14, wherein the first surface is substantially parallel to the second surface.

17. The chip package as defined in claim 14, wherein the at least one contact pad is configured to be located distally to the PWB and the ball grid array is configured to be located proximally to the PWB when the package substrate is in contact with the PWB.

18. A method for interconnecting a chip package to a printed wiring board (PWB), the chip package comprising at least one chip and a package substrate for the chip including a first surface having a ball grid array (BGA) of a plurality of solder balls and a second surface having at least one contact pad, wherein the at least one chip is mounted onto the package substrate, the method comprising:
connecting the first surface of the package substrate of the chip package to the PWB via the plurality of solder balls of the BGA; and
connecting the second surface of the package substrate of the chip package to the PWB via at least one bridge lead.

19. An apparatus for interconnecting a chip package to a printed wiring board (PWB), the chip package comprising at least one chip and a package substrate for the chip including a first surface having a ball grid array (BGA) of a plurality of solder balls and a second surface having at least one contact pad, wherein the at least one chip is mounted onto the package substrate, the apparatus comprising:
means for connecting the first surface of the package substrate of the chip package to the PWB via the plurality of solder balls of the BGA; and
means for connecting the second surface of the package substrate of the chip package to the PWB.

20. The apparatus as defined in claim 19, wherein the means for connecting the second surface comprises at least one bridge lead.

21. The apparatus as defined in claim 20, wherein the at least one bridge lead comprises at least one flying lead style of bridge lead.

22. The apparatus as defined in claim 20, wherein the at least one bridge lead comprises at least one edge wiping style of bridge lead.

23. The apparatus as defined in claim 20, wherein the at least one bridge lead comprises at least one top wiping style of bridge lead.

24. The apparatus as defined in claim 20, wherein the at least one bridge lead comprises at least one double wiping style of bridge lead.

25. The apparatus as defined in claim 24, wherein the at least one bridge lead further comprises a heat sink and thermal interface material for extracting heat from the chip.

26. The apparatus as defined in claim 24, wherein the at least one bridge lead further comprises at least a portion of an integrated Electro-Magnetic Interference shield for the chip.

27. An apparatus for interconnecting a chip package to a printed wiring board (PWB), the chip package comprising at least one chip and a package substrate for the chip including a first surface having a ball grid array (BGA) of a plurality of solder balls adapted to be located between the chip package and the PWB and a second surface having at least one contact pad, wherein the at least one chip is mounted onto the package substrate, the apparatus comprising:
at least one bridge lead for connecting the at least one contact pad on the second surface of the package substrate of the chip package to the PWB.

28. The apparatus as defined in claim 27, wherein the at least one bridge lead comprises at least one flying lead style of bridge lead.

29. The apparatus as defined in claim 27, wherein the at least one bridge lead comprises at least one edge wiping style of bridge lead.

30. The apparatus as defined in claim 27, wherein the at least one bridge lead comprises at least one top wiping style of bridge lead.

31. The apparatus as defined in claim 27, wherein the at least one bridge lead comprises at least one double wiping style of bridge lead.

32. The apparatus as defined in claim 31, wherein the at least one bridge lead further comprises a heat sink and thermal interface material for extracting heat from the chip.

33. The apparatus as defined in claim 31, wherein the at least one bridge lead further comprises at least a portion of an integrated Electro-Magnetic Interference shield for the chip.

34. An electronic interconnection system comprising:
a printed wiring board (PWB) having an interconnection area;
a package substrate for a chip, the package substrate having a first surface and a second surface, the first surface configured to be in contact with the interconnection area to allow communication signals between the chip and the PWB, the second surface having a contact pad electrically connected to the chip; and
a bridge lead for electrically connecting the contact pad of the package substrate with the PWB.

35. An electronic interconnection system comprising:
a printed wiring board (PWB) having an interconnection area;
a package substrate for a chip, the package substrate having a first surface and a second surface, the first surface configured to be in contact with the interconnection area to allow communication signals between the package substrate and the PWB, the second surface having a contact pad; and
a bridge lead for electrically connecting the contact pad of the package substrate with the PWB, wherein the bridge lead increases an amount of electrical signals between the chip and the PWB.

* * * * *